(12) United States Patent
Son et al.

(10) Patent No.: US 9,460,778 B2
(45) Date of Patent: Oct. 4, 2016

(54) STATIC RANDOM ACCESS MEMORY WITH BITLINE BOOST

(71) Applicant: SAMSUNG ELECTRONICS CO., LTD., Suwon-si (KR)

(72) Inventors: Jin Seung Son, Austin, TX (US); Prashant Umakant Kenkare, Austin, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 13/967,543

(22) Filed: Aug. 15, 2013

(65) Prior Publication Data

US 2015/0049540 A1 Feb. 19, 2015

(51) Int. Cl.
*G11C 11/419* (2006.01)
*G11C 7/12* (2006.01)

(52) U.S. Cl.
CPC ............... *G11C 11/419* (2013.01); *G11C 7/12* (2013.01)

(58) Field of Classification Search
CPC ................................ G11C 11/419; G11C 7/12
USPC .................................................. 365/154, 156
See application file for complete search history.

(56) References Cited

U.S. PATENT DOCUMENTS

| | | | |
|---|---|---|---|
| 4,581,718 A | 4/1986 | Oishi | |
| 4,947,374 A * | 8/1990 | Wada | G11C 8/18 365/195 |
| 6,137,732 A | 10/2000 | Inaba | |
| 6,856,574 B2 * | 2/2005 | Iwahashi | G11C 7/22 365/194 |
| 7,292,495 B1 * | 11/2007 | Kenkare | G11C 5/147 365/203 |
| 7,626,854 B1 * | 12/2009 | Yang | G11C 11/413 365/154 |
| 8,023,351 B2 | 9/2011 | Hirabayashi | |
| 8,654,571 B2 * | 2/2014 | John | B01L 3/50273 324/649 |
| 2003/0185043 A1 * | 10/2003 | Masuda | G11C 11/413 365/154 |
| 2005/0117422 A1 * | 6/2005 | Urayama | G11C 7/12 365/203 |
| 2005/0128855 A1 * | 6/2005 | Joshi | G11C 7/22 365/230.06 |
| 2007/0237021 A1 * | 10/2007 | Pelley, III | G11C 7/08 365/189.18 |
| 2008/0117666 A1 * | 5/2008 | Russell | G11C 11/412 365/154 |
| 2010/0232244 A1 * | 9/2010 | Hirabayashi | G11C 7/12 365/208 |
| 2011/0267901 A1 * | 11/2011 | Yang | G11C 11/413 365/189.09 |
| 2013/0308399 A1 * | 11/2013 | Kohli | G11C 7/227 365/189.16 |
| 2014/0112062 A1 * | 4/2014 | Trivedi | G11C 11/419 365/154 |
| 2014/0169106 A1 * | 6/2014 | Kolar | G11C 7/1096 365/189.02 |

FOREIGN PATENT DOCUMENTS

| | | |
|---|---|---|
| JP | 11328973 A | 11/1999 |
| KR | 100239882 B1 | 1/2000 |
| KR | 100477814 B1 | 8/2005 |
| KR | 100504555 B1 | 8/2005 |

* cited by examiner

*Primary Examiner* — Vu Le
*Assistant Examiner* — Sung Cho
(74) *Attorney, Agent, or Firm* — Sughrue Mion, PLLC

(57) ABSTRACT

A static random access memory includes a memory cell array, a control logic configured to generate a first write clock signal and a second write clock signal each of which having a pulse width shorter than a pulse width of a clock signal in response to the clock signal, a row decoder configured to select a word line in response to the second write clock signal during a write operation, a column selector configured to select a bit line and an inverted bit line, a sense amplifier configured to sense states of the selected bit line and the selected inverted bit line during a read operation and a write driver configured to bias the selected bit line and the selected inverted bit line in response to the first write clock signal during the write operation.

18 Claims, 12 Drawing Sheets

STATIC RANDOM ACCESS MEMORY WITH BITLINE BOOST

BACKGROUND

1. Field

Apparatuses consistent with exemplary embodiments relate to semiconductor memories, and more particularly, to a static random access memory.

2. Description of the Related Art

A semiconductor memory is a memory device embodied using a semiconductor such as silicon (Si), germanium (Ge), gallium arsenide (GaAs), indium phosphide (InP), etc. A semiconductor memory is classified into a volatile memory and a nonvolatile memory.

A volatile memory loses data stored therein when a power is interrupted. A volatile memory includes a static RAM, a dynamic RAM, a synchronous DRAM, etc. A nonvolatile memory maintains stored data even when a power is interrupted. A nonvolatile memory includes a read only memory (ROM), a programmable ROM (PROM), an electrically programmable ROM (EPROM), an electrically erasable and programmable ROM (EEPROM), a flash memory, a magnetic RAM (MRAM), a resistive RAM (RRAM), a ferroelectric RAM (FRAM), etc.

A static random access memory (SRAM) is being widely used in a field requiring high performance like a cache memory or a buffer memory because of the SRAM has a high response speed and lower power consumption compared with a dynamic random access memory (DRAM). The SRAM is widely used in a mobile device using a limited power supply (e.g., a power supply from a battery).

SUMMARY

One or more exemplary embodiments provide a static random access memory having a reduced consuming power.

According to an aspect of an exemplary embodiment, there is provided a static random access memory including a memory cell array comprising a plurality of memory cells; a control logic configured to generate a first write clock signal and a second write clock signal in response to a received clock signal, each of the first and second write clock signal having a pulse width shorter than a pulse width of the clock signal; a row decoder connected to the plurality of memory cells through a plurality of word lines and configured to select a word line in response to the second write clock signal during a write operation; a column selector connected to the plurality of memory cells through a plurality of bit lines and a plurality of inverted bit lines and configured to select a bit line and an inverted bit line; a sense amplifier connected to the bit line and the inverted bit line selected by the column selector and configured to sense states of the selected bit line and the selected inverted bit line during a read operation; and a write driver connected to the bit line and the inverted bit line selected by the column selector and configured to bias the selected bit line and the selected inverted bit line in response to the first write clock signal during the write operation.

According to another aspect of an exemplary embodiment, there is provided a static random access memory including a memory cell array including a plurality of memory cells; a row decoder connected to the plurality of memory cells through a plurality of word lines and configured to select a word line during a write operation; a column selector connected to the plurality of memory cells through a plurality of bit lines and a plurality of inverted bit lines and configured to select a bit line and an inverted bit line; a sense amplifier connected to the bit line and the inverted bit line selected by the column selector and configured to sense states of the selected bit line and the selected inverted bit line during a read operation; and a write driver connected to the bit line and the inverted bit line selected by the column selector and configured to boost one of the selected bit line and the selected inverted bit line to a negative voltage during the write operation.

According to still another aspect of an exemplary embodiment, there is provided a method of performing a write operation of a memory device comprising a plurality of memory cells, the method including: selecting a word line from among a plurality of word lines associated with the plurality of memory cells; applying a turn-on voltage to the selected word line in response to a clock signal; selectively discharging one of a bit line or an inverted bit line in response to write data and the clock signal during a predetermined write time; boosting one of the discharged bit line or inverted bit line to a negative voltage in response to an elapse of the predetermined write time; and applying a turn-off voltage to the selected word line following elapsation of a predetermined delay, such that the predetermined delay elapsation occurs following the boosting of the discharged bit line or inverted bitline to a negative voltage.

BRIEF DESCRIPTION OF THE FIGURES

The above and/or other aspects will be more clearly understood from the following detailed description taken in conjunction with the accompanying drawings.

DETAILED DESCRIPTION OF THE EXEMPLARY EMBODIMENTS

Figure 1:
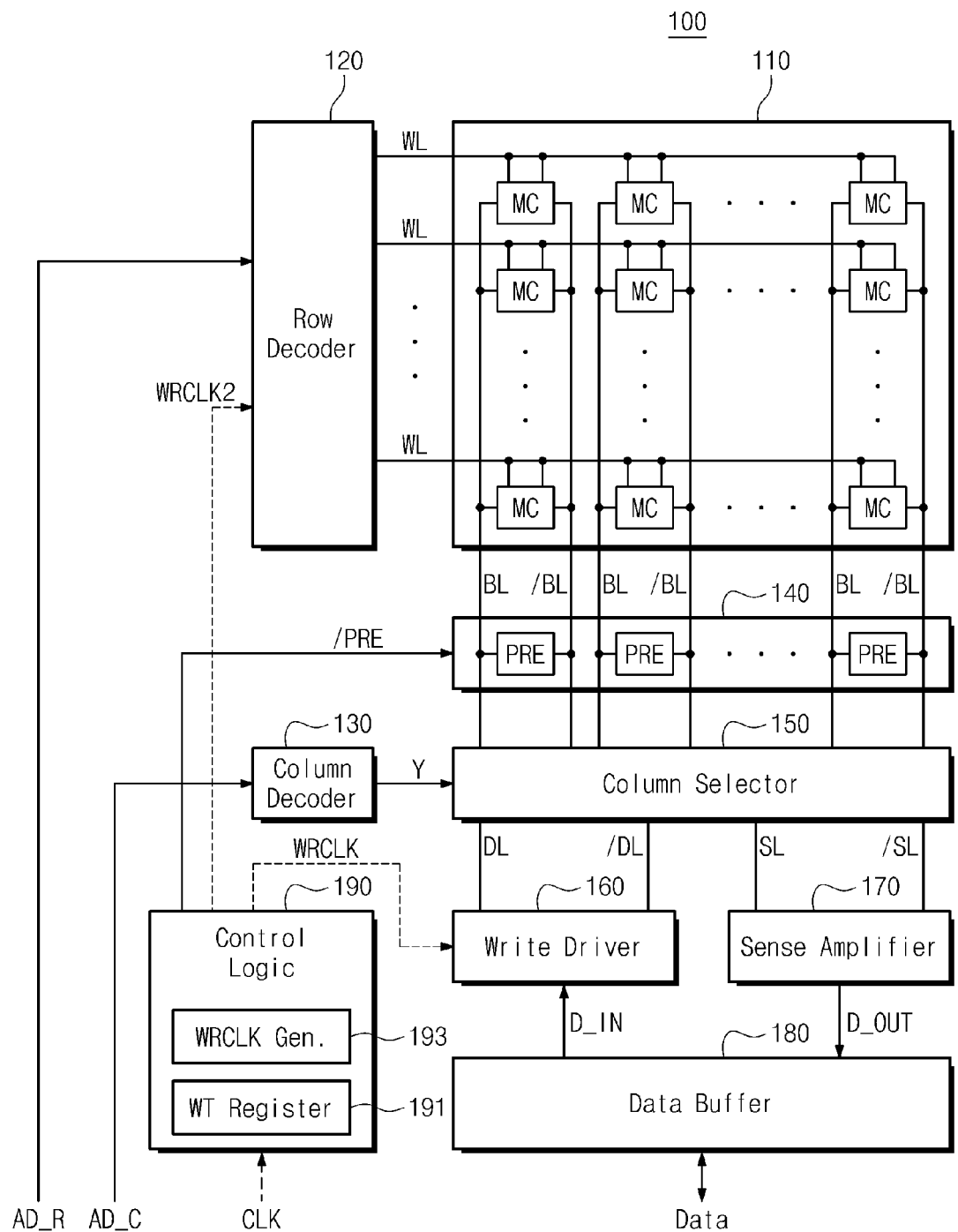
FIG. 1 is a block diagram illustrating a static random access memory in accordance with an exemplary embodiment.

Exemplary embodiments will be described more fully hereinafter with reference to the accompanying drawings.

The exemplary embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

FIG. 1 is a block diagram illustrating a static random access memory (SRAM) 100 in accordance with an exemplary embodiment. Referring to FIG. 1, the SRAM 100 includes a memory cell array 110, a row decoder 120, a column decoder 130, a precharge circuit 140, a column selector 150, a write driver 160, a sense amplifier 170, a data buffer 180 and a control logic 190.

The memory cell array 110 includes a plurality of memory cells MC. The plurality of memory cells MC is respectively connected to word lines WL, bit lines BL and inverted bit lines /BL. Namely, each memory cell is connected to one word line, one bit line and one inverted bit line. Memory cells MC arranged along one row direction are connected to a same word line WL. Memory cells MC arranged along one column direction are connected to a same bit line BL and a same inverted bit line /BL.

The row decoder 120 is connected to the memory cells MC through the word lines WL. The row decoder 120 is configured to receive a row address AD_R and a second write clock signal WRCLK2 and select or unselect the word lines WL according to the received row address AD_R and the received second write clock signal WRCLK2. The row decoder 120 may select a word line corresponding to the row address AD_R and apply a turn-on voltage to the selected word line in response to the second write clock signal WRCLK2. The turn-on voltage may be, for example, a supply voltage VDD.

The column decoder 130 may select the bit lines BL and the inverted bit lines /BL in response to a column address AD_C. The column decoder 130 may output, to the column selector 150, a signal indicating the selected bit line and the selected inverted bit line as a column select signal Y.

The precharge circuit 140 may precharge the bit lines BL and the inverted bit lines /BL in response to a precharge signal /PRE. The precharge circuit 140 may precharge the bit lines BL and the inverted bit lines /BL to a predetermined voltage (e.g., the supply voltage VDD) when a write operation or a read operation is performed. The precharge circuit 140 includes a plurality of precharge units PRE. Each precharge unit PRE may precharge a bit line and an inverted bit line corresponding thereto.

The column selector 150 may select or unselect the bit lines BL and the inverted bit lines /BL in response to the column select signal Y. The column selector 150 may select bit lines BL of a predetermined unit and inverted bit lines /BL corresponding thereto among bit lines BL and inverted bit lines /BL.

The write driver 160 is connected to the column selector 150 through data lines DL and inverted data lines /DL. The data lines DL and the inverted data lines /DL may be connected to the bit lines BL and the inverted bit lines /BL selected by the column selector 150 respectively. The write driver 160 may discharge one line among the data lines DL (or the selected bit lines BL) and the inverted data lines /DL (or the selected inverted bit lines /BL) when a write operation is performed. Also, the write driver 160 may boost one line among the data lines DL (or the selected bit lines BL) and the inverted data lines /DL (or the selected inverted bit lines /BL) to a negative voltage when the write operation is performed. The write driver 160 may operate in response to the write clock signal WRCLK. An operation of the write driver 160 will be described in detail with reference to FIGS. 2 through 10.

The sense amplifier 170 is connected to the column selector 150 through sense lines SL and inverted sense lines /SL. The sense lines SL and the inverted sense lines /SL may be connected to the bit lines BL and the inverted bit lines /BL selected by the column selector 150 respectively. The sense amplifier 170 may sense a state (e.g., a voltage level) of the sense lines SL (or the selected bit lines BL) and the inverted sense lines /SL (or the selected inverted bit lines /BL) while performing the read operation.

The data buffer 180 may exchange data with the outside. The data buffer 180 may transfer data being received from the outside to the write driver 160 as input data D_IN. The data buffer 180 receives output data D_OUT from the sense amplifier 170 to transfer the received output data D_OUT to the outside.

The control logic 190 receives a clock signal CLK from the outside. The control logic 190 may generate the write clock signals WRCLK AND WRCLK2 in response to the clock signal CLK received from the outside. The control logic 190 may include a write time register 191 and a write clock generator 193.

The write time register 191 is configured to store information about one or more write times. Theose one or more write times relates to behavior of the write operation. For example, the write time register 191 can provide a predetermined write time and a predetermined word line turn off time (or delay) associated with behavior of the write operation. The write time register 191 may be a register programmable by an external device.

The write clock generator 193 may generate the write clock signals WRCLK and WRCLK2 in response to write times stored in the write time register 191 and the clock signal CLK. When a write operation is performed, the write clock generator 193 may be synchronized with an edge of the clock signal CLK to generate the write clock signals WRCLK AND WRCLK2. Specifically, when a write operation is performed, the write clock generator 193 may be synchronized with a first edge (e.g., a rising edge) of the clock signal CLK to form a first edge (e.g., rising edge) of the write clock signals WRCLK AND WRCLK2. It is likely that the rising edges of the write clock signals WRCLK AND WRCLK2 will be delayed with respect to each other. When the write operation is performed, the write clock generator 193 may be synchronized with a first edge (e.g., a rising edge) of the clock signal CLK to form a second edge (e.g., falling edge) of the write clock signals WRCLK AND WRCLK2. The second edge of the write clock signal WRCLK may be delayed by a predetermined write time compared with the first edge of the write clock signal WRCLK The second edge of the second write clock signal WRCLK2 may be offset with respect to the second edge of the write clock signal WRCLK, and this offset can be controlled by a predetermined word line turn off time (or delay). Both the predetermined write time and the predetermined word line turn off time (or delay) can be provided by the write time register 191. In a preferred embodiment, the predetermined write time might be set based on the time required to complete a robust write of a plurality of first memory cells under various process, voltage, and temperature variations. Furthermore, the predetermined word line turn off time (or delay) might be set based on the time required to complete a robust write of a plurality of second memory cells, which are substantially more difficult to write relative to the plurality of first memory cells. For example, the plurality of second memory cells might suffer from more extreme process variation effects relative to the plurality of first memory cells. Examples of process variation effects include threshold voltage variation, gate dielectric thickness variation, and dimensional variations such as transistor width and length. It is anticipated that the magnitude of the write time and the word line turn off time can be determined based on either pre-fabrication simulation results or testing of fabricated silicon.

The control logic 190 may control an overall operation of the static random access memory 100. In FIG. 1, the control logic 190 outputs the precharge signal /PRE and the write clock signals WRCLK AND WRCLK2 but exemplary embodiments of the disclosure are not limited thereto. The control logic 190 may additionally output various control signals for controlling various elements of the static random access memory 100.

Figure 2:
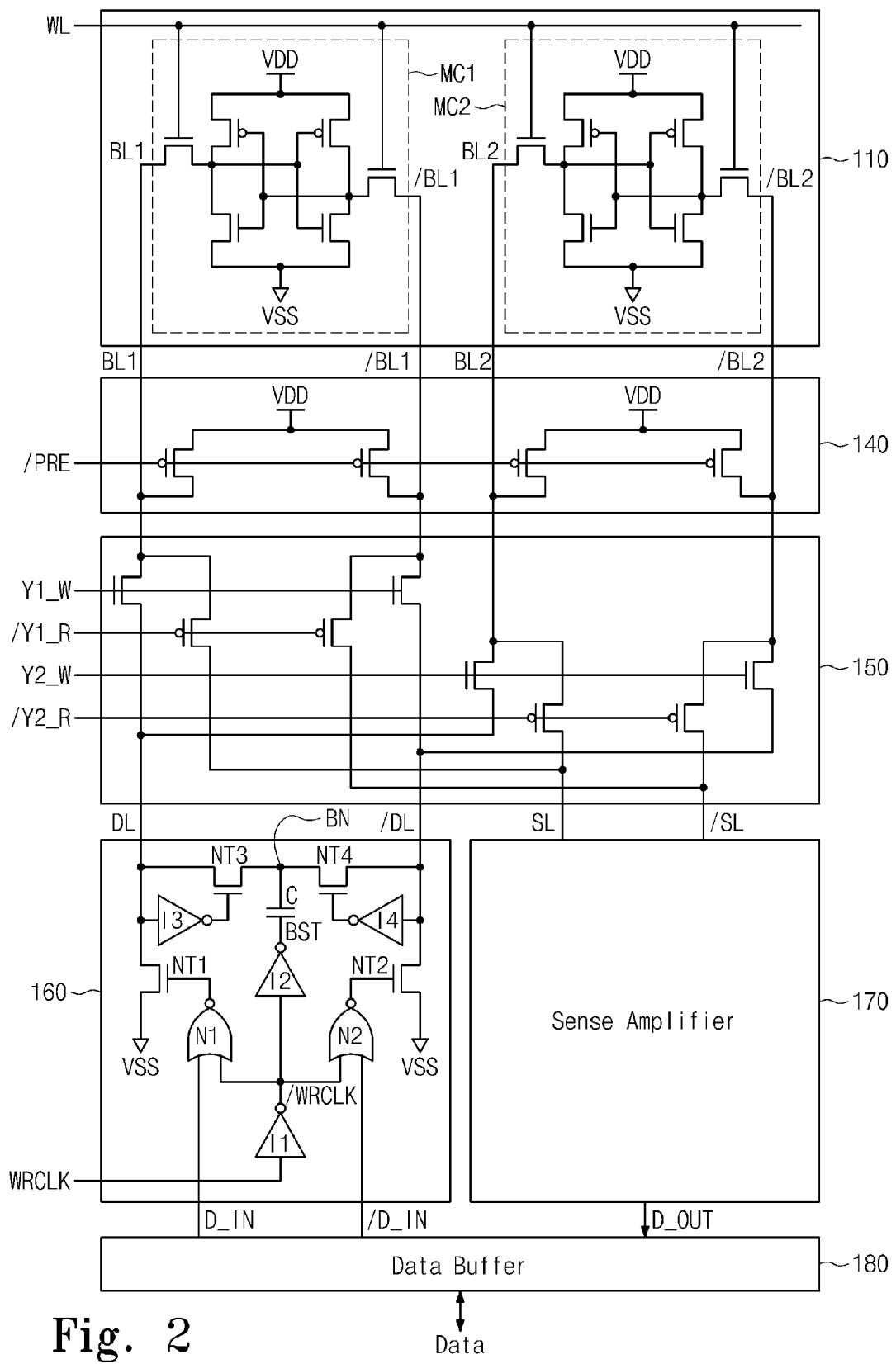
FIG. 2 is a circuit diagram illustrating a portion of a static random access memory in accordance with an exemplary embodiment.

FIG. 2 is a circuit diagram illustrating a portion of a static random access memory in accordance with an exemplary embodiment.

For convenience of description, the memory cell array 110 includes two memory cells MC1 and MC2 connected to one word line WL, two bit lines BL1 and BL2 and two inverted bit lines /BL1 and /BL2, among the memory cells MC. The precharge circuit 140 includes elements corresponding to the two memory cells MC1 and MC2, respectively. The column selector 150 is configured to select one of the two bit lines BL1 and BL2 to connect the selected bit line to a data line DL or a sense line SL and to select one of the two inverted bit lines /BL1 and /BL2 to connect the selected inverted bit line to an inverted data line /DL or an inverted sense line /SL. The write driver 160 includes elements corresponding to one data line DL and one inverted data line /DL. A detailed description of the sense amplifier 170 and the data buffer 180 is omitted. However, exemplary embodiments of the disclosure are not limited thereto.

Referring to FIGS. 1 and 2, the memory cell MC1 is connected to the word line WL, the bit line BL1 and the inverted bit line /BL1. The memory cell MC2 is connected to the word line WL, the bit line BL2 and the inverted bit line /BL2. Each of the memory cells MC1 and MC2 may have a 6T structure.

The precharge circuit 140 may precharge the bit lines BL1 and BL2 and the inverted bit lines /BL1 and /BL2 to the supply voltage VDD in response to the precharge signal /PRE.

The column selector 150 may connect the bit line BL1 and the inverted bit line /BL1 to the data line DL and the inverted data line /DL respectively in response to a column select signal Y1_W. The column selector 150 may connect the bit line BL1 and the inverted bit line /BL1 to the sense line SL and the inverted sense line /SL respectively in response to a column select signal /Y1_R. The column selector 150 may connect the bit line BL2 and the inverted bit line /BL2 to the data line DL and the inverted data line /DL respectively in response to a column select signal Y2_W. The column selector 150 may connect the bit line BL2 and the inverted bit line /BL2 to the sense line SL and the inverted sense line /SL respectively in response to a column select signal /Y2_R.

The write driver 160 includes a plurality of inverters I1-I4, a plurality of NOR logics N1 and N2, a plurality of transistors NT1-NT4 and a capacitor C.

The inverter I1 receives the write clock signal WRCLK from the control logic 190. The inverter I1 may invert the received write clock signal WRCLK to output an inverted write clock signal /WRCLK.

The NOR logic N1 is configured to perform a logic operation on write data D_IN and the inverted write clock signal /WRCLK to output a logical operation result. The NOR logic N1 may be a NOR gate or other logic elements for performing a NOR logic operation.

The transistor NT1 may selectively discharge the data line DL to a ground voltage VSS in response to an output signal of the NOR logic N1. The transistor NT1 may selectively discharge a bit line selected by the column selector 150 and electrically connected to the data line DL to the ground voltage VSS.

The NOR logic N1 and the transistor NT1 may constitute a discharge circuit for selectively discharging a bit line selected by the column selector 150 in response to the write clock signal WRCLK and the write data D_IN.

The NOR logic N2 is configured to perform a logic operation on the inverted write data /D_IN and the inverted clock signal /WRCLK to output a logical operation result. The NOR logic N2 may be a NOR gate or other logic elements for performing a NOR operation.

The transistor NT2 may selectively discharge the inverted data line /DL to the ground voltage VSS in response to an output signal of the NOR logic N2. The transistor NT2 may selectively discharge an inverted bit line selected by the column selector 150 and electrically connected to the inverted data line /DL to the ground voltage VSS.

The NOR logic N2 and the transistor NT2 may constitute a discharge circuit for selectively discharging an inverted bit line selected by the column selector 150 in response to the write clock signal WRCLK and the inverted write data /D_IN.

The inverter I2 is configured to receive the inverted write clock signal /WRCLK. The inverter N2 is configured to invert the received inverted write clock signal /WRCLK to output a boost signal BST.

The inverter I3 is configured to invert a voltage level of the data line DL to output the inverted voltage level. The inverter I3 may invert a voltage level of a bit line selected by the column selector 150 and electrically connected to the data line DL to output the inverted voltage level.

The transistor NT3 may selectively connect the data line DL and a boost node BN in response to an output signal of the inverter I3. Thus, the transistor NT3 may electrically connect a bit line selected by the column selector 150 and electrically connected to the data line DL to the boost node BN.

The inverter I4 is configured to invert a voltage level of the inverted data line /DL to output the inverted voltage level. The inverter I4 may invert a voltage level of an inverted bit line selected by the column selector 150 and electrically connected to the inverted data line /DL to output the inverted voltage level.

The transistor NT4 may selectively connect the inverted data line /DL and the boost node BN in response to an output signal of the inverter I4. Thus, the transistor NT4 may electrically connect an inverted bit line selected by the column selector 150 and electrically connected to the inverted data line /DL to the boost node BN.

The capacitor C is provided between the boost node BN and an output node of the inverter I2.

The inverters I2-I4, the transistors NT3-NT4 and the capacitor C may constitute a boost circuit for boosting one of the bit line and the inverted bit line selected by the column selector 150 to a negative voltage in response to the write clock signal WRCLK.

Figure 3:
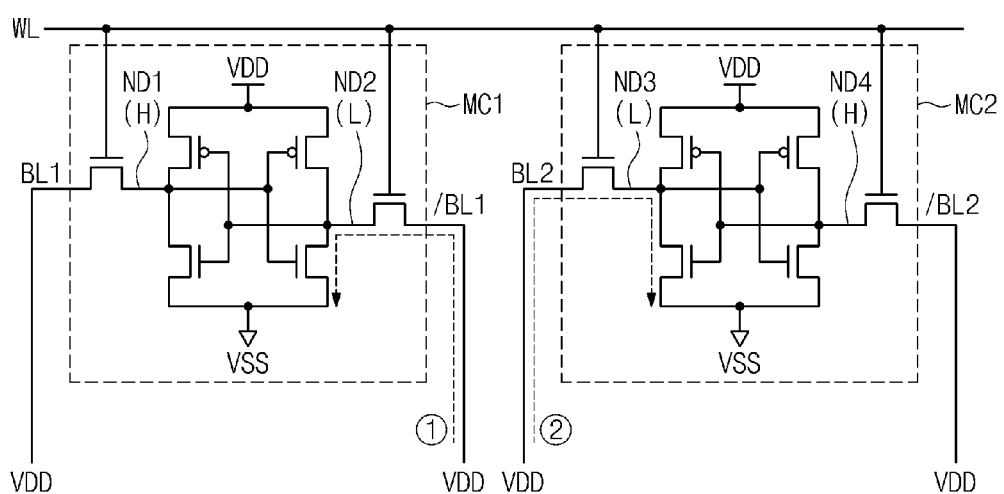
FIG. 3 is a circuit diagram for explaining a unwanted current flow that occurs in a memory cell.

FIG. 3 is a circuit diagram for explaining unwanted current flow that occurs in a memory cell. Referring to FIGS. 1 through 3, it is assumed that the word line WL is a selected word line. Also, it is assumed in FIG. 3 that the memory cell includes memory cells MC1 and MC2 that are not selected by the column selector 150. That is, the bit lines BL1 and BL2 and the inverted bit lines /BL1 and /BL2 that are connected to the memory cells MC1 and MC2 may be electrically separated from the write driver 160 and the sense amplifier 170. The bit lines BL1 and BL2 and the inverted bit lines /BL1 and /BL2 may be precharged to the supply voltage VDD by the precharge circuit 140.

The memory cell MC1 may have first and second nodes ND1 and ND2. Levels of the first and second nodes ND1 and ND2 may be determined according to data stored in the memory cell MC1. The first node ND1 of the memory cell MC1 may have a logic high (H) and the second node ND2 of the memory cell MC1 may have a logic low (L).

The memory cell MC2 may have third and fourth nodes ND3 and ND4. Levels of the third and fourth nodes ND3 and ND4 may be determined according to data stored in the memory cell MC2. The third node ND3 of the memory cell MC2 may have a logic low (L) and the fourth node ND4 of the memory cell MC2 may have a logic high (H). The memory cell MC2 may store data different from that of the memory cell MC1.

When a turn-on voltage is applied to the selected word line WL, transistors connected to the word line are turned on. In the memory cell MC1, a current may flow from the second node ND2 at logic low (L) to a node of the ground voltage VSS. Similarly, in the memory cell MC2, a current may flow from the third node ND3 at logic low (L) to a node of the ground voltage VSS. That is, during the write operation, when the turn-on voltage is applied to the selected word line WL, a unwanted current flow may be generated from memory cells MC1 and MC2 which are not a target of the write operation and not selected by the column selector 150.

An unwanted current flow is generated in the unselected memory cells MC1 and MC2 while the turn-on voltage is applied to the selected word line WL. To reduce the duration of unwanted current flow, the static random access memory (SRAM) 100 in accordance with an exemplary embodiment may generate the second write clock signal WRCLK2 based on the clock signal CLK. The second write clock signal WRCLK2 may have an active state (or a pulse width) shorter than that of the clock signal CLK. As described previously, the second write clock signal WRCLK2 controls the turn on duration of the selected word line WL. As a result, the selected word line WL will be subject to the turn on voltage for a duration shorter than that of the clock signal CLK active pulse width. The shortened turn on time for the selected word line WL ensures that the unwanted current in memory cells MC1 and MC2 flows for a duration shorter than the active pulse width of the clock signal CLK. Thus, the static random access memory (SRAM) 100 having low power consumption and improved write time may be provided.

Figure 4:
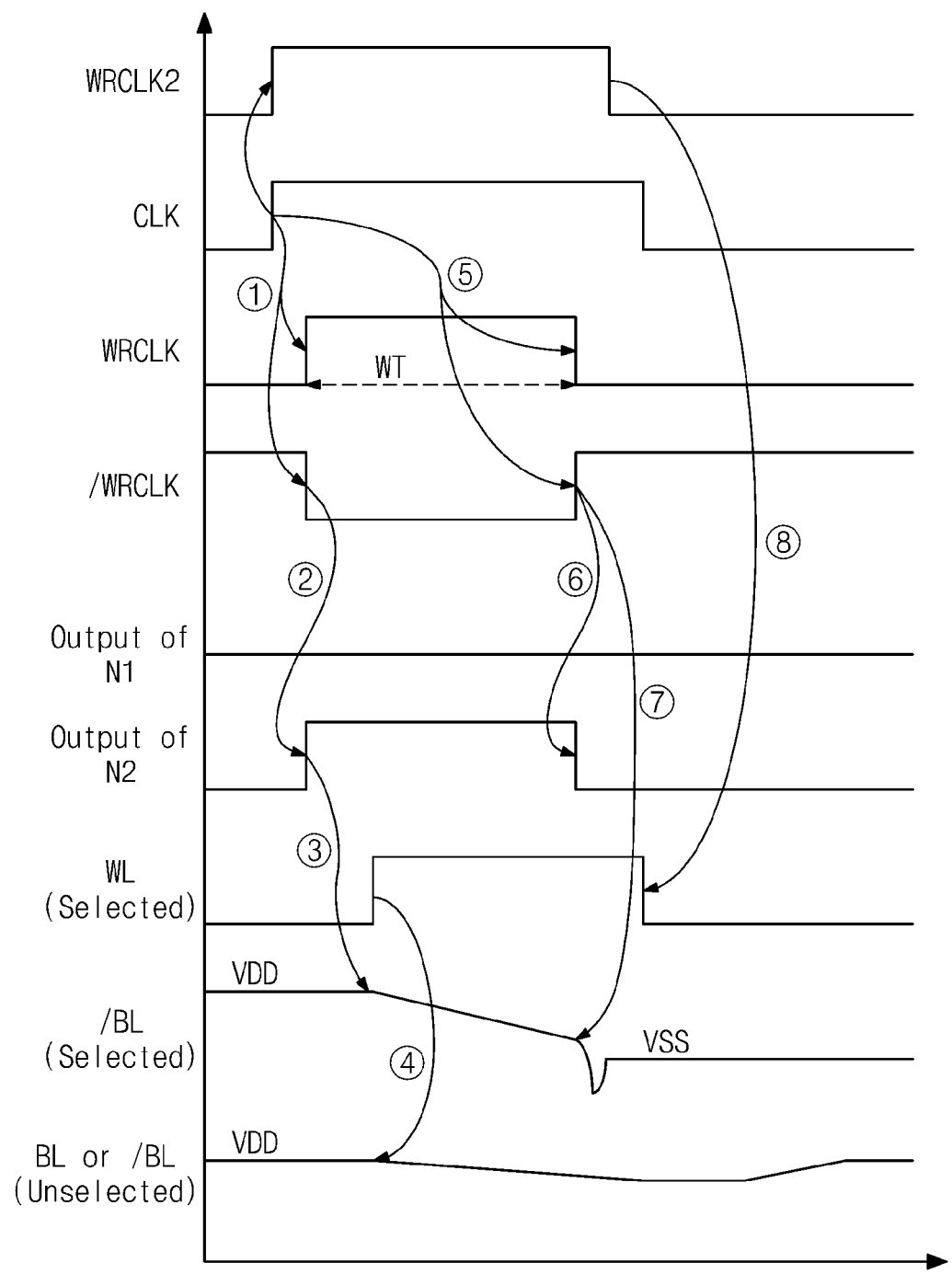
FIG. 4 is a timing chart illustrating a write operation of a static random access memory in accordance with an exemplary embodiment.

FIG. 4 is a timing chart illustrating a write operation of a static random access memory 100 in accordance with an exemplary embodiment. For illustrative purposes, a case in which the write data D_IN has a logic high and the inverted write data /D_IN has a logic low is illustrated in FIG. 4.

Referring to FIGS. 1, 2 and 4, the control logic 190 receives the clock signal CLK having a first edge (a rising edge) and a second edge (a falling edge).

As indicated by an arrow ①, the write clock generator 193 of the control logic 190 may be synchronized with the first edge (rising edge) of the clock signal CLK to generate the write clock signals WRCLK and WRCLK2 A first edge (rising edge) of the write clock signals WRCLK and WRCLK2 may be synchronized with the first edge (rising edge) of the clock signal CLK. Due to a delay in the control logic 190 or the write clock generator 193, the first edge (rising edge) of the write clock signals WRCLK and WRCLK2 may be delayed compared with the first edge (rising edge) of the clock signal CLK.

When the write clock signal WRCLK is generated, the inverter I1 of the write driver 160 may generate the inverted write clock signal /WRCLK. Due to a delay in the inverter I1, a first edge (falling edge) of the inverted write clock signal /WRCLK may be delayed compared with the first edge (rising edge) of the write clock signal WRCLK, although it is assumed the delay does not occur in FIG. 4.

As indicated by an arrow ②, since the inverted write data /D_IN has a logic low, when the inverted write clock signal /WRCLK is deactivated (e.g., transit to a logic low), the NOR logic N2 output transitions to a logic high. That is, an output of the NOR logic N2 has a first edge (rising edge) being synchronized with the first edge (falling edge) of the inverted write clock signal /WRCLK. Since the write data D_IN has a logic high, an output of the NOR logic N1 maintains an inactive state (e.g., a logic low).

As indicated by an arrow ③, when the NOR logic N2 outputs a logic high, an inverted bit line selected by the column selector 150 and connected to the inverted data line /DL may be discharged to the ground voltage VSS.

After the NOR logic N2 outputs a logic high, a turn-on voltage is applied to the selected word line WL. Those skilled in the art will recognize that the application of a turn-on voltage to the selected word line WL can also occur during or even prior to the NOR2 logic N2 providing a logic high. The turn-on voltage being applied to the selected word line WL may be synchronized with the first edge (rising edge) of the clock signal CLK or the write clock signal WRCLK2, or the first edge (falling edge) of the inverted write clock signal /WRCLK. The turn-on voltage may be delayed from, for example, the first edge (rising edge) of the write clock signal WRCLK2 or the clock signal CLK to be applied.

When the turn-on voltage is applied to the selected word line WL, a node of a memory cell connected to an inverted bit line selected by the column selector 150 is discharged to the ground voltage VSS. That is, a write operation is performed. A unwanted current flow may be generated in memory cells connected to a bit line or an inverted bit line not selected by the column selector 150. As indicated by an arrow ⓪, a voltage of a bit line or an inverted bit line from which a unwanted current flow is generated may be reduced.

Figure 5:
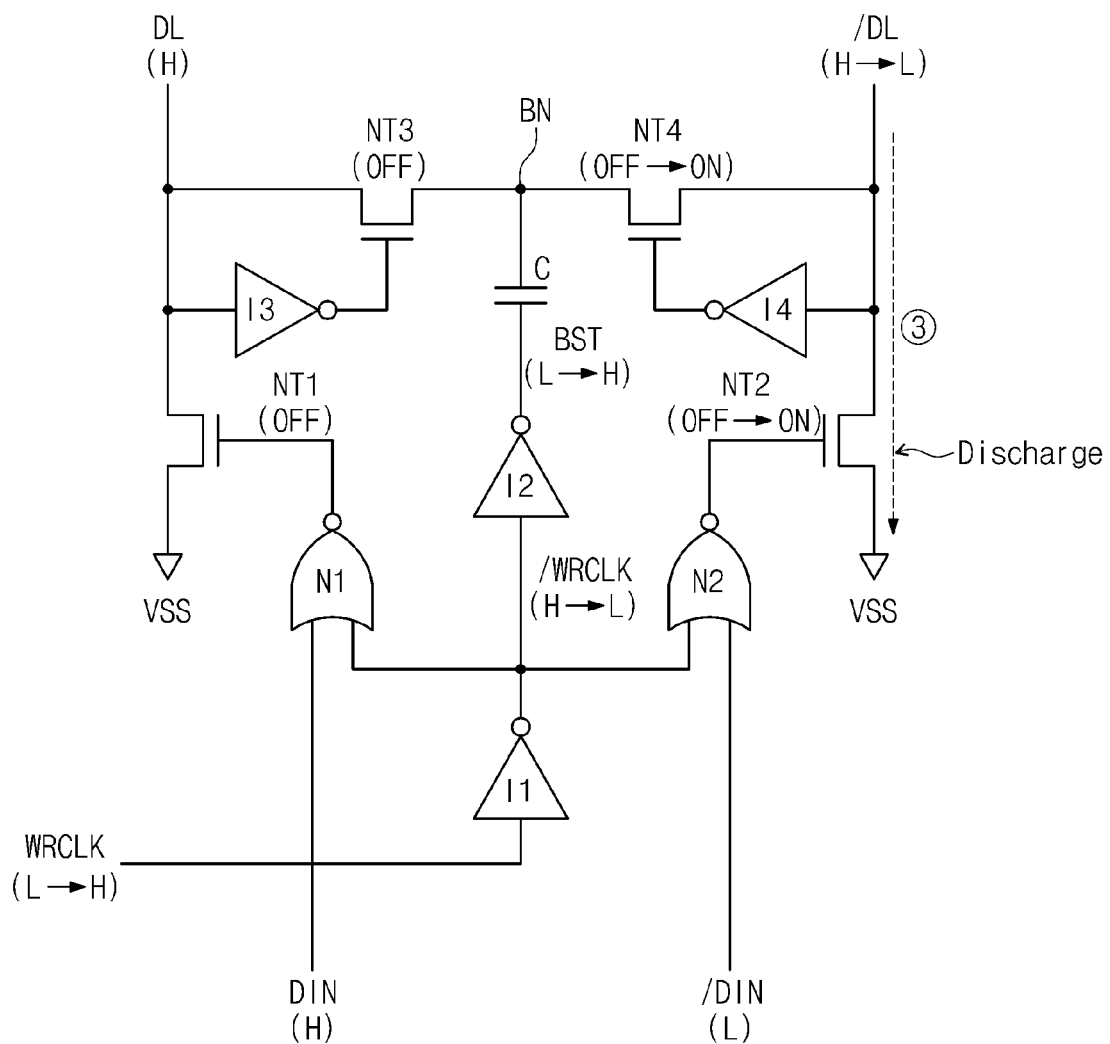
FIG. 5 is a logic circuit diagram for explaining an example operation of a write driver in response to a first edge of a write clock signal.

A write operation synchronized with the first edge (rising edge) of the write clock signal WRCLK is illustrated in FIG. 5. Referring to FIG. 5, as the write clock signal WRCLK transits from a logic low (L) to a logic high (H), an output signal of the NOR logic N2 transits from a logic low (L) to a logic high (H). According to the output signal of the NOR logic N2, the transistor NT2 is changed from a turn-off state to a turn-on state. That is, the inverted data line /DL is discharged to the ground voltage VSS.

When the inverted data line /DL has a logic high, the inverter 14 outputs a logic low (L). Thus, the transistor NT4 is turned off and the boost node BN is electrically separated from the inverted data line /DL. That is, the inverted data line /DL may be discharged without affecting the boost node.

When a discharge of the inverted data line /DL continues, the inverter 14 may output a logic high. The transistor NT4 may be turned on in response to an output signal of the inverter 14. When the transistor NT4 is turned on, the boost node BN may be electrically connected to the inverted data line /DL.

Referring back to FIGS. 1, 2 and 4, as indicated by an arrow ⑤, after a predetermined write time WT passes from the first edge (rising edge) of the write clock signal WRCLK, a second edge (falling edge) of the write clock WRCLK is formed. In the same manner, a second edge (rising edge) of the inverted write clock signal /WRCLK is formed.

As indicated by an arrow ⑥, the NOR logic N2 may output a logic low in response to the second edge (rising edge) of the inverted write clock signal /WRCLK.

As indicated by an arrow ⑦, in response to the second edge (rising edge) of the inverted write clock signal /WRCLK, an inverted bit line selected by the column selector 150 and connected to the inverted data line /DL may be boosted to a negative voltage.

As indicated by an arrow ⑧, a turn-on voltage is interrupted from applying to the selected word line WL may be in response to the second edge (falling edge) of the second write clock signal WRCLK2 or the second edge (rising edge) of the inverted write clock signal /WRCLK. An operation synchronized with the second edge (falling edge) of the write clock signal WRCLK is illustrated in FIG. 6.

Figure 6:
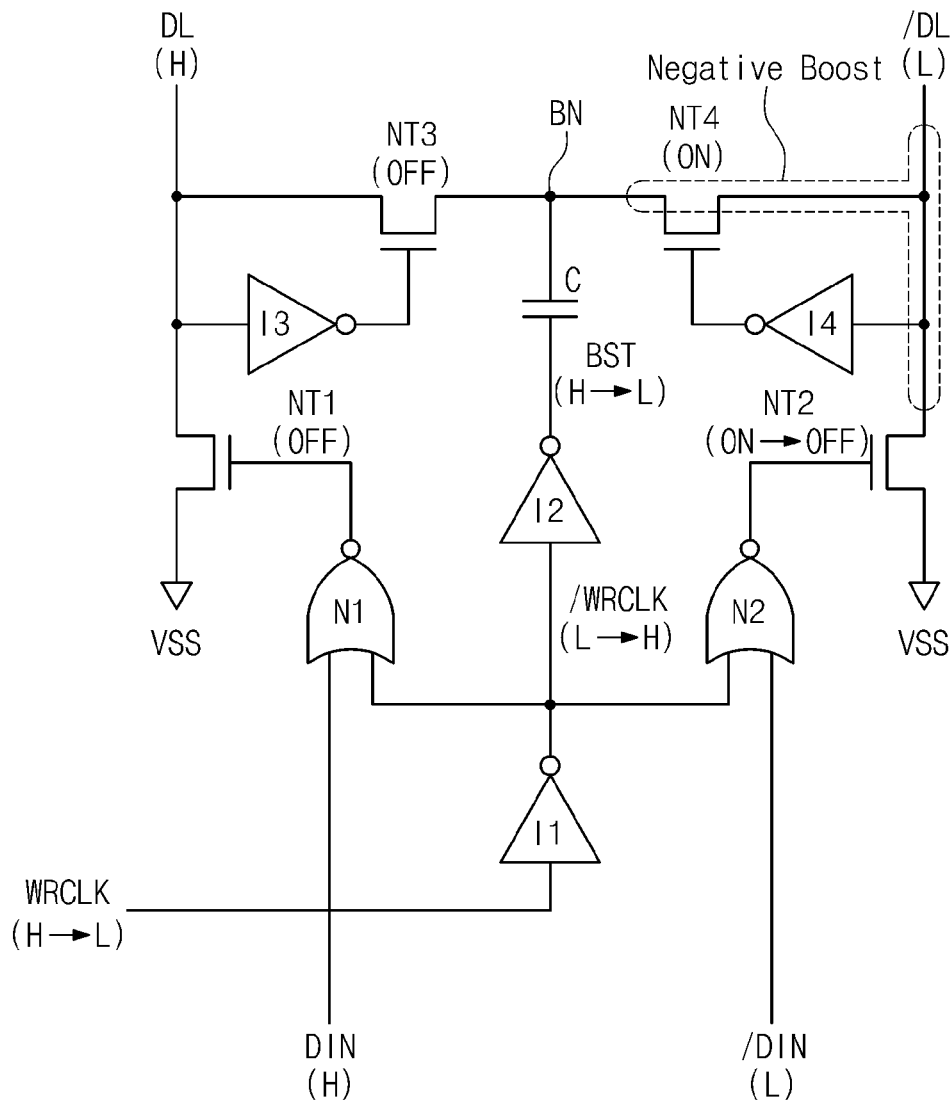
FIG. 6 is a logic circuit diagram for explaining an example operation of a write driver in response to a second edge of a write clock signal.

Referring to FIG. 6, as the write clock signal WRCLK transitions from a logic high (H) to a logic low (L), the inverted write clock signal /WRCLK transits from a logic low (L) to a logic high (H). In response to transition of the inverted write clock signal /WRCLK, the NOR logic N2 outputs a logic low. According to an output signal of the NOR logic N2 having a logic low, the transistor NT4 is turned off. That is, a discharge of an inverted bit line selected by the column selector 150 and connected to the inverted data line /DL is interrupted.

As the inverted write clock signal /WRCLK transits from a logic low (L) to a logic high (H), the boost signal BST transits from a logic high (H) to a logic low (L). Transition of the boost signal BST is transferred to the boost node BN through the capacitor C. The boost node BN may be coupled to the boost signal BST through the capacitor C. As the boost signal BST transits from a logic high (H) to a logic low (L), a voltage of the boost node BN, that is, a voltage of an inverted bit line selected by the column selector 150 and connected to the inverted data line /DL is reduced by an amount corresponding to a transition width of the boost signal BST.

Referring back to FIGS. 1, 2 and 4, a voltage of an inverted bit line selected by the column selector 150 and connected to the inverted data line /DL may be boosted to a negative voltage by transition of the boost signal BST and a coupling due to the transition of the boost signal BST. Next, through a node of the internal ground voltage VSS of a memory cell connected to an inverted bit line selected by the column selector 150 and connected to the inverted data line /DL, a voltage of the inverted bit line selected by the column selector 150 and connected to the inverted data line /DL may be restored to the ground voltage VSS.

A turn-on voltage may cease to be applied to the selected word line WL after a voltage of the inverted bit line selected by the column selector 150 and is connected to the inverted data line /DL is boosted to a negative voltage or is restored to the ground voltage VSS. The row decoder 120 may interrupt a turn-on voltage from applying to the selected word line WL when a predetermined word line turn off time (or delay) elapses from the second edge (falling edge) of the write clock signal WRCLK. In a preferred embodiment, the word line turn on and turn off behavior is controlled by the second write clock signal WRCLK2 whose rising and falling edges are respectively adjusted relative to the rising and falling edges of the write clock signal WRCLK.

According to an exemplary embodiment, the row decoder 120 applies a turn-on voltage to the selected word line WL in response to the second write clock signal WRCLK2 having an active state (or a pulse width) shorter than that of the clock signal CLK. Since time in which a turn-on voltage is applied to the selected word line WL is reduced, a unwanted current flow being generated in memory cells connected to bit lines and inverted bit lines that are not selected by the column selector 150 is reduced. Thus, a static random access memory having reduced power consumption may be provided.

When the time in which a turn-on voltage is applied to the selected word line WL is reduced, time in which the inverted bit line and the inverted data line /DL selected by the column selector 150 are discharged is reduced. Reduction in discharge time may cause a write error. The write driver 160 discharges one of a bit line and an inverted bit line selected by the column selector 150 and boosts the selected bit line or inverted bit line to a negative voltage. Thus, even when the time in which a turn-on voltage is applied to the selected word line WL is reduced, an inverted bit line selected by the column selector 150 and is connected to the inverted data line /DL is sufficiently discharged and a write error may be substantially prevented.

Figure 7:
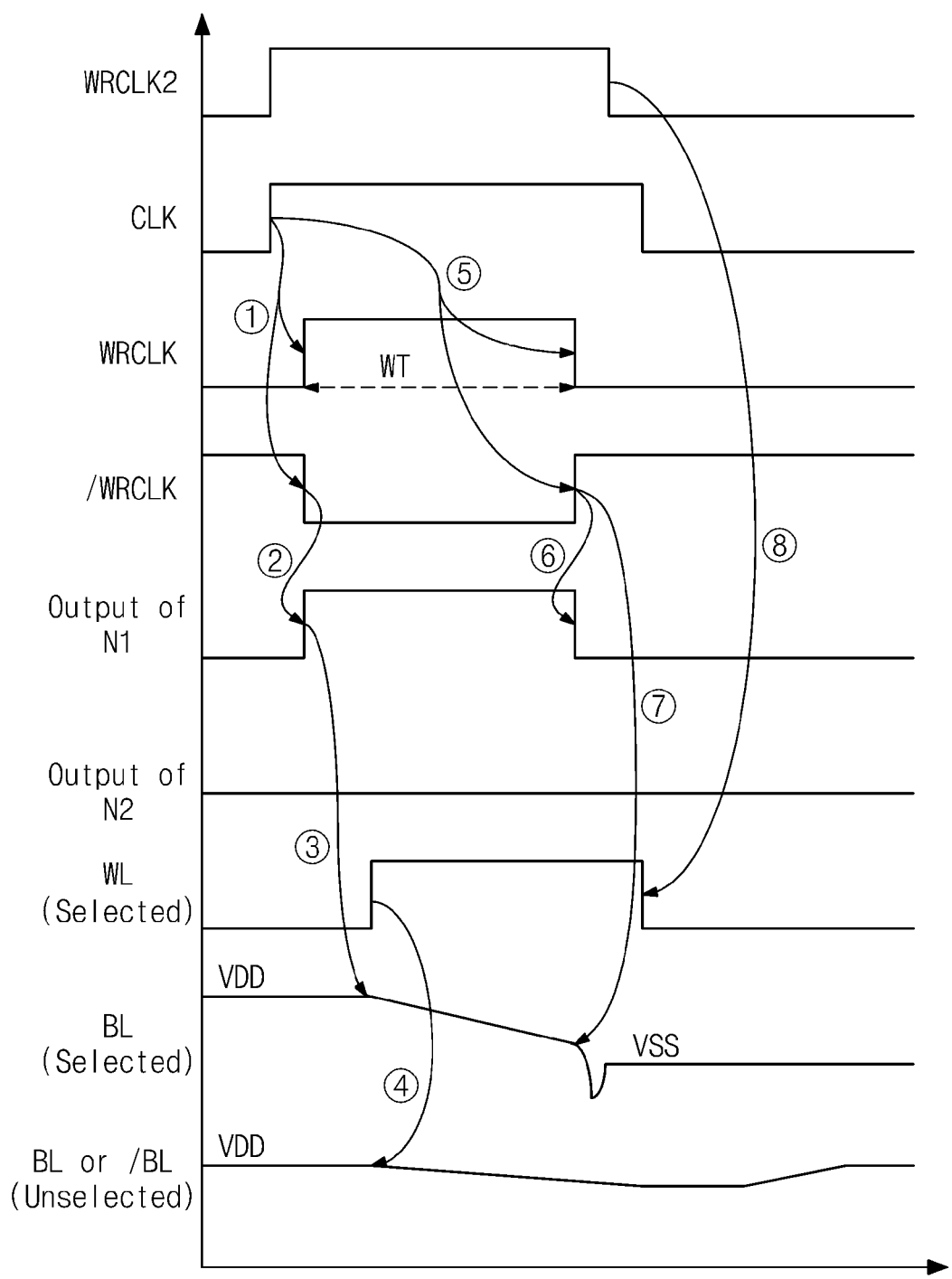
FIG. 7 is a timing chart illustrating a write operation of a static random access memory in accordance with another exemplary embodiment.

FIG. 7 is a timing chart illustrating a write operation of a static random access memory 100 in accordance with another exemplary embodiment. A case in which the write data D_IN has a logic low (L) and the inverted write data /D_IN has a logic high (H) is illustrated in FIG. 7. Referring to FIGS. 1, 2 and 7, the control logic 190 receives a clock signal CLK having a first edge (rising edge) and a second edge (falling edge).

As indicated by an arrow ①, the write clock generator 193 of the control logic 190 may generate the write clock signals WRCLK and WRCLK2 in synchronization with the first edge (rising edge) of the clock signal CLK. A first edge (rising edge) of the write clock signals WRCLK and WRCLK2 may be synchronized with the first edge (rising edge) of the clock signal CLK.

As the write clock signal WRCLK is generated, the inverter I1 of the write driver 160 may generate the inverted write clock signal /WRCLK.

As indicated by an arrow ②, since the write data D_IN has a logic low, when the inverted write clock signal /WRCLK is deactivated (e.g., transits to a logic low), the NOR logic N1 output a logic high. An output of the NOR logic N1 has a first edge (rising edge) in synchronization with the first edge (falling edge) of the inverted write clock signal /WRCLK. Since the inverted write data /D_IN has a logic high, the NOR logic N2 maintains an inactive state (logic low).

As indicated by an arrow ③, when the NOR logic N1 outputs a logic high, a bit line selected by the column selector 150 and connected to the data line DL may be discharged to the ground voltage VSS.

After the NOR logic N1 outputs a logic high, a turn-on voltage is applied to the selected word line WL. Those skilled in the art will recognize that the application of a turn-on voltage to the selected word line WL can also occur during or even prior to the NOR2 logic N1 providing a logic high. The turn-on voltage which is applied to the selected word line WL may be synchronized with the first edge (rising edge) of the second write clock signal WRCLK2 or the clock signal CLK, or a first edge (falling edge) of the inverted write clock signal /WRCLK. The turn-on voltage may be delayed from the first edge (rising edge) of the write clock signal WRCLK or the clock signal CLK to be applied to the selected word line WL.

When the turn-on voltage is applied to the selected word line WL, a node of a memory cell connected to a bit line selected by the column selector 150 is discharged to the ground voltage VSS. That is, a write operation is performed. A unwanted current flow may be generated in memory cells connected to a bit line or an inverted bit line that is not selected by the column selector 150. As indicated by an arrow ④, a voltage of the bit line or the inverted bit line in which a unwanted current flow occurs may be reduced.

Figure 8:
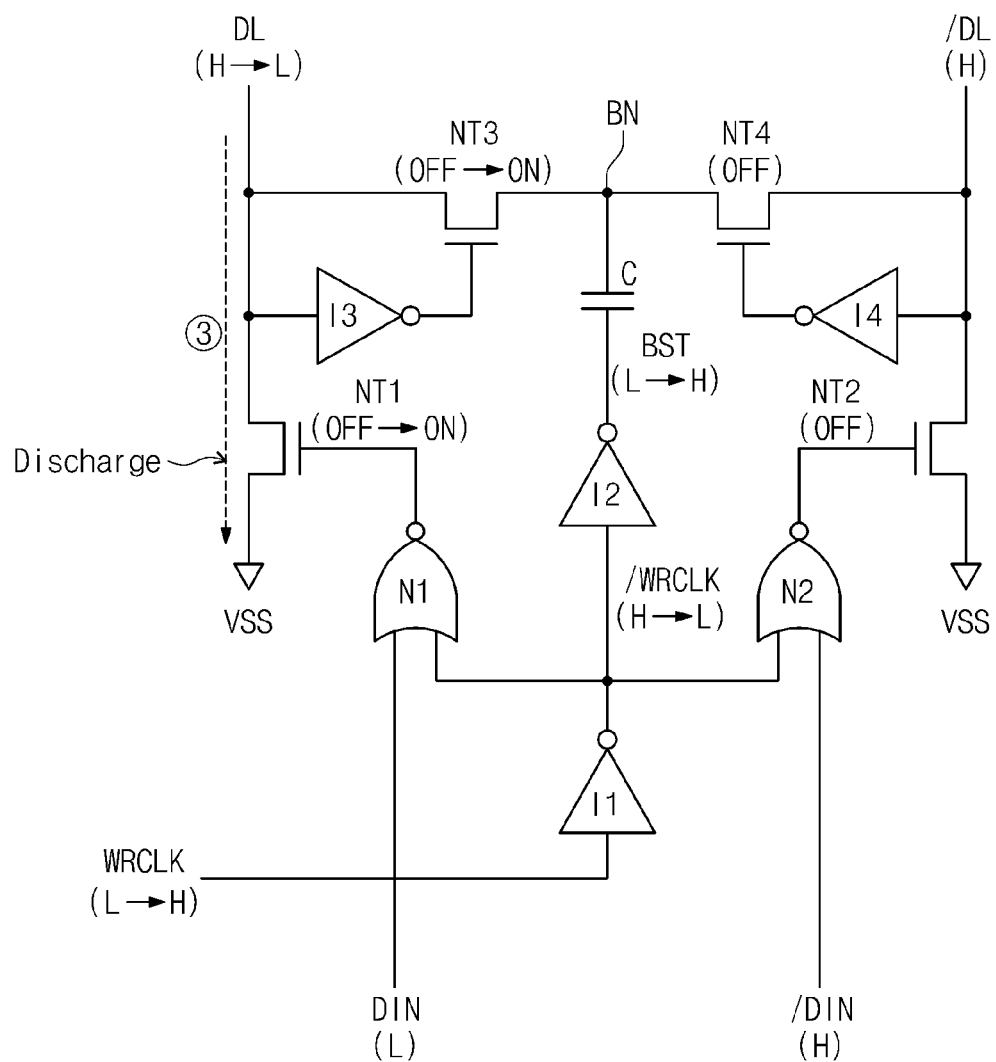
FIG. 8 is a logic circuit diagram for explaining another example operation of a write driver in response to a first edge of a write clock signal.

An operation synchronized with the first edge (rising edge) of the write clock signal WRCLK is illustrated in FIG. 8. Referring to FIG. 8, as the write clock signal WRCLK transits from a logic low (L) to a logic high (H), an output signal of the NOR logic N1 transits from a logic low (L) to a logic high (H). According to the output signal of the NOR logic N1, the transistor NT1 transits from a turn-off state to a turn-on state. That is, the data line DL is discharged to the ground voltage VSS.

When the data line DL transits to a logic low (L), the inverter 13 may output a logic high. In response to an output signal of the inverter 13, the transistor NT3 may be turned on. If the transistor NT3 is turned on, the boost node BN may be electrically connected to the data line DL.

Referring back to FIGS. 1, 2 and 7, as indicated by an arrow ⑤, after the predetermined write time WT passes from the first edge (rising edge) of the write clock signal WRCLK, a second edge (falling edge) of the write clock signal WRCLK is formed. In the same manner, a second edge (rising edge) of the inverted write clock signal /WRCLK may be formed.

As indicated by an arrow ⑥, in response to the second edge (rising edge) of the inverted write clock signal /WRCLK, the NOR logic N1 may output a logic low.

As indicated by an arrow ⑦, in response to the second edge (rising edge) of the inverted write clock signal /WRCLK, a bit line selected by the column selector 150 and connected to the data line DL may be boosted to a negative voltage.

As indicated by an arrow ⑧, in response to the second edge (falling edge) of the second write clock signal WRCLK2, a turn-on voltage may cease to be applied to the selected word line WL. An operation synchronized with the second edge (falling edge) of the write clock signals WRCLK and WRCLK2 is illustrated in FIG. 9.

Figure 9:
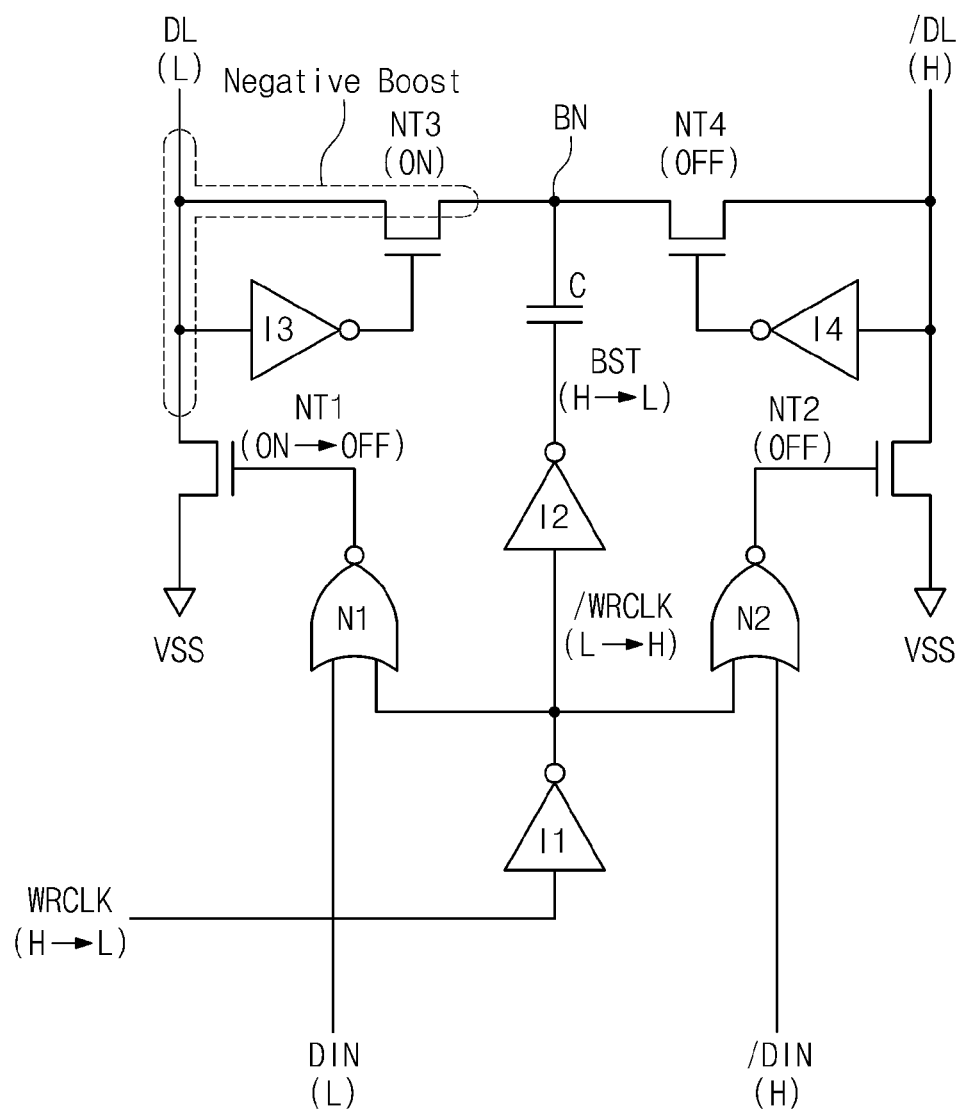
FIG. 9 is a logic circuit diagram for explaining another example operation of a write driver in response to a second edge of a write clock signal.

Referring to FIG. 9, when the write clock signal WRCLK transits from a logic high (H) to a logic low (L), the inverted write clock signal /WRCLK transits from a logic low (L) to a logic high (H). In response to transition of the inverted write clock signal /WRCLK, the NOR logic N1 outputs a logic low. According to the output signal of the NOR logic N1, the transistor NT1 is turned off. A discharge of a bit line selected by the column selector 150 and connected to the data line DL is interrupted.

As the inverted write clock signal /WRCLK transits from a logic low (L) to a logic high (H), the boost signal BST transits from a logic high (H) to a logic low (L). Transition of the boost signal BST is transferred to the boost node BN through the capacitor C. The boost node BN may be coupled to the boost signal through the capacitor C. When the boost signal BST transits from a logic high (H) to a logic low (L), a voltage of the boost node BN, that is, a voltage of a bit line selected by the column selector 150 and connected to the data line DL may be reduced by an amount corresponding to a transition width of the boost signal BST.

Referring back to FIGS. 1, 2 and 7, a voltage of a bit line selected by the column selector 150 and connected to the data line DL may be boosted to a negative voltage by transition of the boost signal BST and a coupling due to the transition of the boost signal BST. Next, by a node of the internal ground voltage VSS of a memory cell connected to a bit line selected by the column selector 150 and connected to the data line DL, a voltage of the bit line selected by the column selector 150 and connected to the data line DL may be restored to the ground voltage VSS.

A turn-on voltage may cease to be applied to the selected word line WL when a voltage of the bit line selected by the column selector 150 and connected to the data line DL is boosted to a negative voltage or is restored to the ground voltage VSS. The row decoder 120 may not apply a turn-on voltage when a predetermined word line turn off time (or delay) time passes from the second edge (falling edge) of the write clock signal WRCLK2.

According to an exemplary embodiment, the row decoder 120 applies a turn-on voltage to the selected word line WL in response to the write clock signal WRCLK2 having an active state (or a pulse width) shorter than that of the clock signal CLK. Since the time in which a turn-on voltage is applied to the selected word line WL is reduced, a unwanted current flow generated in memory cells connected to bit lines and inverted bit lines that are not selected by the column selector 150 is reduced. Thus, a static random access memory having reduced power consumption may be provided.

When the time in which a turn-on voltage is applied to the selected word line WL is reduced, the time in which the bit line and the data line DL selected by the column selector 150 are discharged is reduced. Reduction in discharge time may cause a write error. The write driver 160 discharges one of a bit line and an inverted bit line selected by the column selector 150 and boosts the selected bit line or inverted bit line to a negative voltage. Thus, even when the time in which a turn-on voltage is applied to the selected word line WL is reduced, a bit line selected by the column selector 150 and connected to the data line DL is sufficiently discharged and a write error may be substantially prevented.

Figure 10:
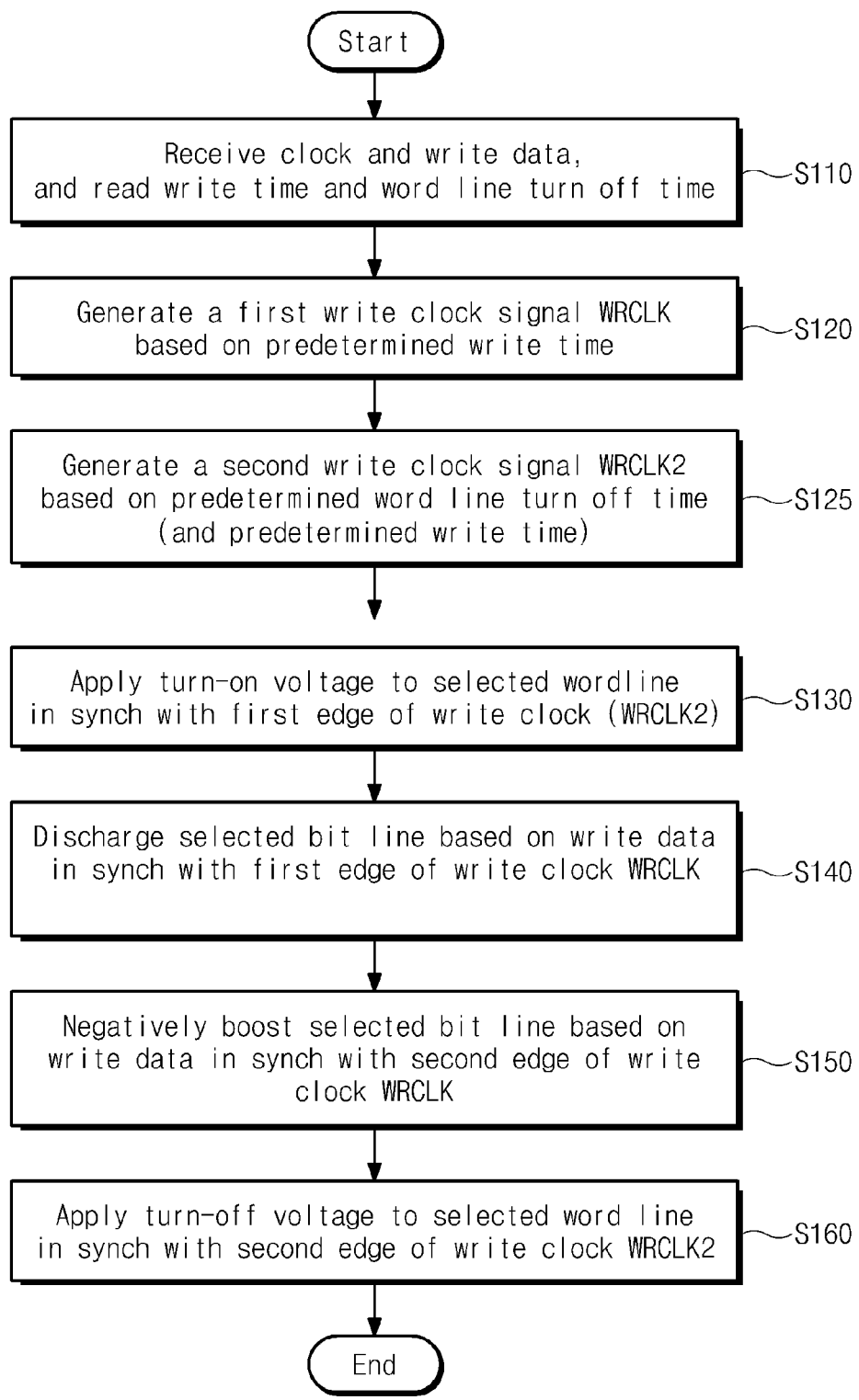
FIG. 10 is a flow chart illustrating an operation of a static random access memory in accordance with an exemplary embodiment.

FIG. 10 is a flow chart illustrating an operation of a static random access memory 100 in accordance with an exemplary embodiment. Referring to FIGS. 1, 2 and 10, in operation S110, the clock signal CLK and the write data D_IN are received. Further, information of the predetermined write time and the predetermined word line turn off time (or delay) are read.

In operation S120, the write clock signal WRCLK of which a first edge (rising edge) is synchronized with a first edge (rising edge) of the clock signal CLK and a pulse width corresponding to the predetermined write time is generated, the WRCLK pulse width being optimized for writing a plurality of first memory cells In operation S125, the second write clock signal WRCLK2 of which a first edge (rising edge) is synchronized with a first edge (rising edge) of the clock signal CLK and a pulse width greater than or equal to the sum of the predetermined write time and the predetermined word line turn off time (or delay) is generated, the WRCLK2 pulse width being optimized for writing a plurality of second memory cells.

In operation S130, a turn-on voltage is applied to a selected word line in synchronization with the first edge (rising edge) of the clock signal CLK or the second write clock signal WRCLK2.

In operation S140, a bit line or an inverted bit line selected on the basis of the write data D_IN is discharged in synchronization with the first edge (rising edge) of the write clock signal WRCLK or a first edge (falling edge) of an inverted write clock signal /WRCLK.

In operation S150, a bit line or an inverted bit line selected on the basis of the write data D_IN is negatively boosted in synchronization with a second edge (falling edge or rising edge) of the write clock signal WRCLK or the inverted write clock signal /WRCLK.

In operation S160, a turn-off voltage is applied to a selected word line in synchronization with the second edge (falling edge or rising edge) of the second write clock signal WRCLK2 or in relation to the inverted write clock signal /WRCLK. A turn-off voltage may be the ground voltage VSS.

In the above-described embodiments, the row decoder 120 and the write driver 160 operate in response to the write clock signals WRCLK and WRCLK2. In an applied embodiment, the row decoder 120 and the write driver 160 may operate in response the same write clock signal (e.g., WRCLK). In this case, the write driver may perform the negative boosting and turning off of word lines in response to a second edge (e.g., falling edge) of the same write clock signal (e.g., WRCLK).

Figure 11:
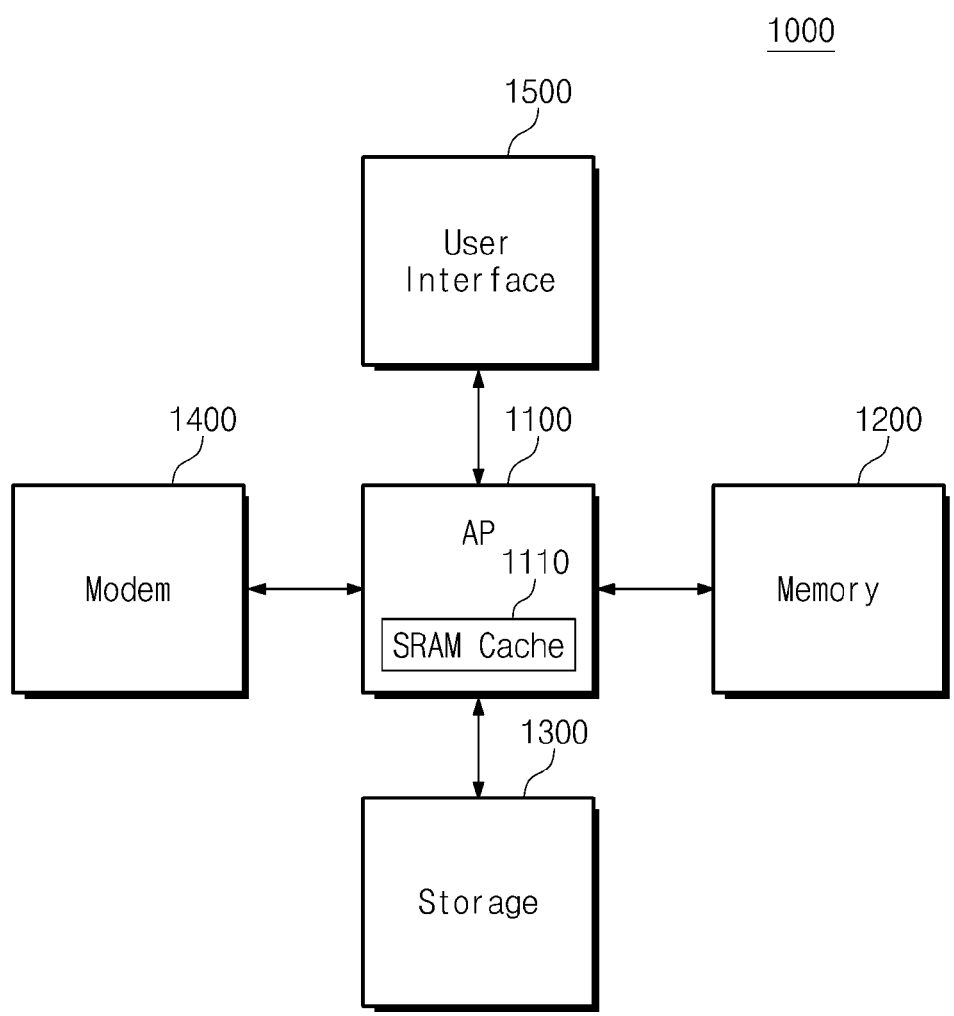
FIG. 11 is a block diagram illustrating a mobile device in accordance with an exemplary embodiment.

FIG. 11 is a block diagram illustrating a mobile device 1000 in accordance with an exemplary embodiment. Referring to FIG. 11, the mobile device 1000 includes an application processor 1100, a memory 1200, storage 1300, a modem 1400, and a user interface 1500.

The application processor 1100 may control an overall operation of the mobile device 1000 and may perform a logical operation. The application processor 1100 may be implemented in a system-on-chip. The application processor 1100 may include a cache memory 1110. The cache memory 1110 may include the static random access memory 100 described with reference to FIGS. 1 through 10. When the static random access memory 100 described with reference to FIGS. 1 through 10 is provided as the cache memory 1110, the application processor 1100 may have reduced power consumption and improved operation speed.

The memory 1200 may communicate with the application processor 1100. The memory 1200 may be an operation memory of the application processor 1100 or the mobile device 1000. The memory 1200 may include a volatile memory such as an SRAM, a DRAM, a synchronous DRAM, etc. and a nonvolatile memory such as a flash memory, a phase change RAM (PRAM), a magnetic RAM (MRAM), a resistive RAM (RRAM), a ferroelectric RAM (FRAM), etc.

The storage 1300 may store data which needs to be stored for a longer period of time in the mobile device 1000. The storage 1300 may include a nonvolatile memory such as a hard disk drive (HDD), a flash memory, a phase change RAM, a magnetic RAM, a resistive RAM, a ferroelectric RAM, etc.

The memory 1200 and the storage 1300 may include the same kind of a nonvolatile memory. The memory 1200 and the storage 1300 may be implemented on a semiconductor integrated circuit.

The modem 1400 may communicate with an external device according to a control of the application processor 1100. The modem 1400 may perform a wire or wireless communication with an external device. The modem 1400 may perform a communication on the basis of at least one of various wireless communication methods such as a long term evolution (LTE), a code division multiple access (CDMA), a Bluetooth, a near field communication (NFC), WiFi, a radio frequency identification, etc. and various wire communication methods such as a universal serial bus (USB), a serial AT attachment (SATA), a small computer small interface (SCSI), FireWire, a peripheral component interconnection (PCI), etc.

The user interface 1500 may communicate with a user according to the control of the application processor 1100. The user interface 1500 may include a user input interface such as a keyboard, a keypad, a button, a touch panel, a touch screen, a touch pad, a touch ball, a camera, a mike, a gyroscope sensor, a vibration sensor, etc. The user interface 1500 may include a user output interface such as a liquid crystal display (LCD), an organic light emitting diode (OLED) display, an active matrix OLED (AMOLED) display, an LED display, a speaker, a motor, etc.

Figure 12:
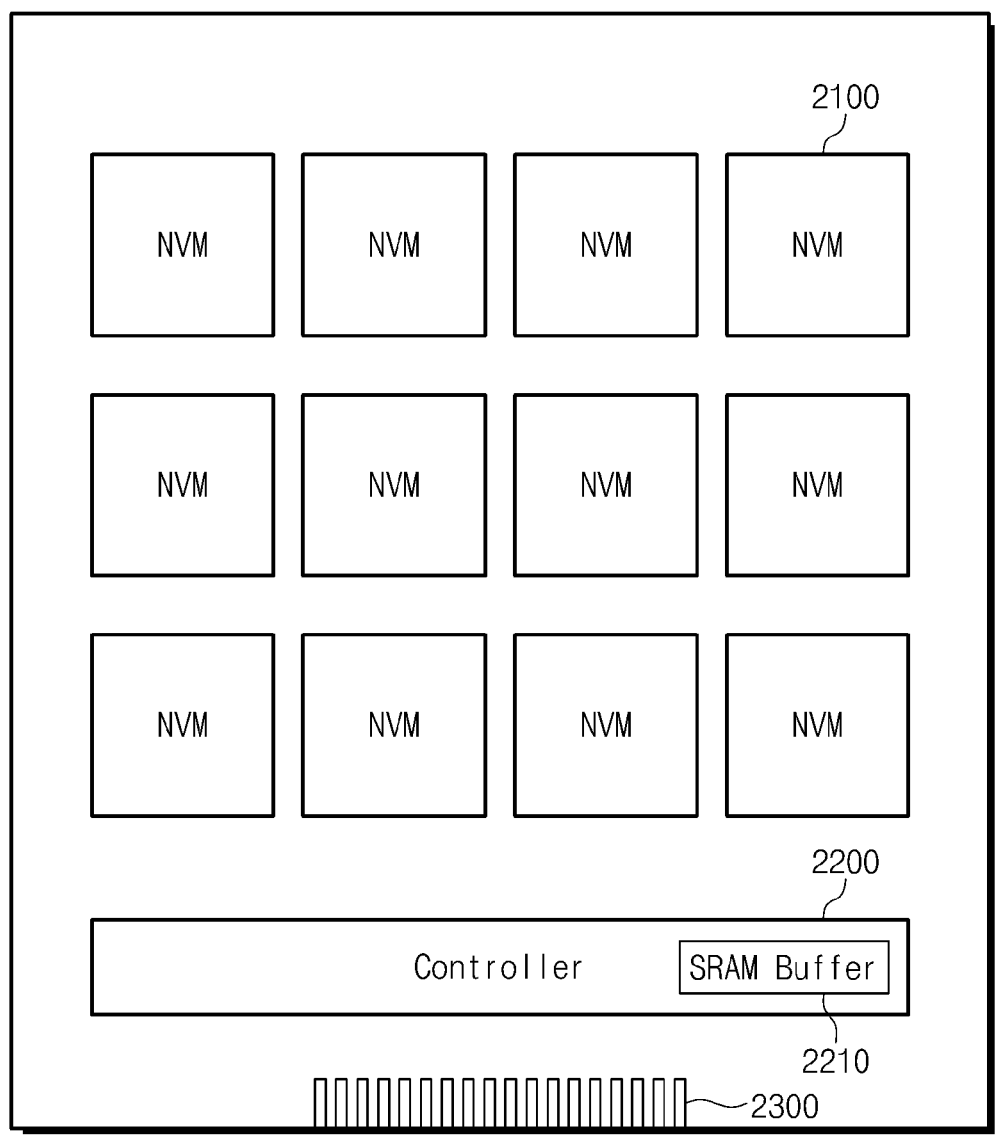
FIG. 12 illustrates a solid state drive in accordance with an exemplary embodiment.

FIG. 12 illustrates a solid state drive 2000 in accordance with an exemplary embodiment. Referring to FIG. 12, the solid state drive 2000 includes a plurality of nonvolatile memories (NVM) 2100, a controller 2200, and a connector 2300.

The plurality of nonvolatile memories 2100 may include a nonvolatile memory such as a flash memory, a PRAM, an MRAM, a FRAM, a RRAM, etc.

The controller 2200 is configured to control the plurality of nonvolatile memories 2100. The controller 2200 includes a buffer memory 2210. The buffer memory 2210 may include the static random access memory 100 described with reference to FIGS. 1 through 10. When the static random access memory 100 described with reference to FIGS. 1 through 10 is provided to the controller 2200 as the buffer memory 2210, the controller 2200 may have reduced power consumption and improved operation speed.

The connector 2300 may electrically connect the solid state drive 2000 with an external device (e.g., a host).

According to an exemplary embodiment, a static random access memory may perform a write operation using the write clock signal having a pulse width shorter than that of a clock signal. Thus, a static random access memory having reduced power consumption and an improved write speed may be provided.

According to an exemplary embodiment, a bit line to be discharged is boosted to a negative voltage when a write operation is performed. Thus, even when shortened write time is applied, a static random access memory may have write reliability.

The above-disclosed subject matter is to be considered illustrative, and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A static random access memory comprising:
a memory cell array comprising a plurality of memory cells;
a control logic configured to generate a first write clock signal and a second write clock signal in response to a received clock signal, wherein each of the first and second write clock signals has a single pulse width during a cycle of the clock signal, the single pulse width being shorter than a pulse width of the clock signal;
a row decoder connected to the plurality of memory cells through a plurality of word lines and configured to select a word line in response to the second write clock signal during a write operation;
a column selector connected to the plurality of memory cells through a plurality of bit lines and a plurality of inverted bit lines and configured to select a bit line and an inverted bit line;
a sense amplifier connected to the bit line and the inverted bit line selected by the column selector and configured to sense states of the selected bit line and the selected inverted bit line during a read operation; and
a write driver connected to the bit line and the inverted bit line selected by the column selector and configured to bias the selected bit line and the selected inverted bit line in response to the first write clock signal during the write operation.

2. The static random access memory of claim 1, wherein one of a rising edge and a falling edge of one or more of the first and second write clock signals are synchronized with one edge of the clock signal.

3. The static random access memory of claim 1, wherein the control logic comprises a write time register configured to store information about a write time and a word line turn off time, and
wherein a rising edge of each of the first and second write clock signals are synchronized with a rising edge of the clock signal and a falling edge of the first write clock signal occurs after the write time elapses from the rising edge of the first write clock signal and a falling edge of the second write clock signal occurs after a time duration relative to the rising edge of the second write clock signal, where the time duration is defined as a sum of the write time and the word line turn off time.

4. The static random access memory of claim 1, wherein the row decoder is configured to apply a turn-on voltage to the selected word line during an active state of the second write clock signal.

5. The static random access memory of claim 1, wherein, during the write operation, the write driver is configured to discharge one of the selected bit line and the selected inverted bit line to a ground voltage.

6. The static random access memory of claim 5, wherein, during the write operation, the write driver is configured to boost the bit line or inverted bit line discharged to the ground voltage to a negative voltage in response to transition of the first write clock signal to an inactive state.

7. The static random access memory of claim 1, wherein the write driver comprises:
a first discharge circuit configured to selectively discharge the bit line selected by the column selector to a ground voltage in response to write data and the first write clock signal;
a second discharge circuit configured to selectively discharge the inverted bit line selected by the column selector to the ground voltage in response to inverted write data and the first write clock signal; and
a boost circuit configured to boost one of the selected bit line and the selected inverted bit line to a negative voltage in response to the first write clock signal.

8. The static random access memory of claim 7, wherein the write driver further comprises a first inverter configured to invert the first write clock signal to output the inverted write clock signal, and
wherein the first discharge circuit, the second discharge circuit, and the boost circuit operate in response to the inverted first write clock signal.

9. The static random access memory of claim 8, wherein the first discharge circuit comprises:
a first logic configured to perform a logical operation on the write data and the inverted first write clock signal to output a logical operation result; and
a first transistor configured to discharge the bit line selected by the column selector to the ground voltage in response to the logical operation result of the first logic.

10. The static random access memory of claim 8, wherein the second discharge circuit comprises:
a second logic configured to perform a logical operation on the inverted write data and the inverted first write clock signal to output a logical operation result; and
a second transistor configured to discharge the inverted bit line selected by the column selector to the ground voltage in response to the logical operation result of the second logic.

11. The static random access memory of claim 8, wherein the boost circuit comprises:
a second inverter configured to invert the inverted write clock signal to output a boost signal;
a third inverter configured to invert a voltage of the bit line selected by the column selector to output a first inverted voltage;
a third transistor configured to electrically connect the bit line selected by the column selector and a boost node according to the first inverted voltage;
a fourth inverter configured to invert a voltage of the inverted bit line selected by the column selector to output a second inverted voltage;
a fourth transistor configured to electrically connect the inverted bit line selected by the column selector and the boost node according to the second inverted voltage; and
a capacitor connected between an output node of the second inverter and the boost node.

12. A static random access memory comprising:
a memory cell array including a plurality of memory cells;
a row decoder connected to the plurality of memory cells through a plurality of word lines and configured to select a word line during a write operation;
a column selector connected to the plurality of memory cells through a plurality of bit lines and a plurality of inverted bit lines and configured to select a bit line and an inverted bit line;
a sense amplifier connected to the bit line and the inverted bit line selected by the column selector and configured to sense states of the selected bit line and the selected inverted bit line during a read operation;
a write driver connected to the bit line and the inverted bit line selected by the column selector and configured to boost one of the selected bit line and the selected inverted bit line to a negative voltage during the write operation; and a control logic configured to control the row decoder and the write driver in response to a clock signal externally provided, wherein the control logic controls the row decoder to apply a turn-on voltage to the selected word line in response to a first edge of the clock signal, and wherein an entire duration of a write cycle, in which the write operation is performed in response to the clock signal, is shorter than a pulse width of the clock signal.

13. The static random access memory of claim 12, wherein the write driver is configured to discharge the one of the selected bit line and the selected inverted bit line during the write operation, and when a write time passes after the one of the selected bit line and the selected inverted bit line begins to be discharged, the write driver is configured to boost the discharged bit line or inverted bit line to a negative voltage.

14. The static random access memory of claim 12, wherein the control logic controls the write driver to discharge one of the selected bit line and the selected inverted bit line in response to the first edge of the clock signal and perform the boost after a write time passes from the first edge of the clock signal.

15. A method of performing a write operation of a memory device comprising a plurality of memory cells, the method comprising:

selecting a word line from among a plurality of word lines associated with the plurality of memory cells;

applying a turn-on voltage to the selected word line in response to a clock signal;

selectively discharging one of a bit line or an inverted bit line in response to write data and the clock signal during a predetermined write time; and boosting one of the discharged bit line or inverted bit line to a negative voltage in response to an elapse of the predetermined write time, wherein an entire duration of a write cycle, in which the write operation is performed in response to the clock signal, is shorter than a pulse width of the clock signal.

16. The method of claim 15, further comprising:

generating a write clock signal in response to the clock signal, the write clock signal having a pulse width corresponding to the predetermined write time, wherein the selectively discharging is performed in response to the write clock signal.

17. The method of claim 16, wherein one of a rising edge and a falling edge of the write clock signal is synchronized with one edge of the clock signal.

18. The method of claim 15, further comprising:

applying a turn-off voltage to the selected word line after a time duration exceeding the predetermined write time elapses such that the time duration is shorter than a pulse width of the clock signal and longer than the predetermined write time.

* * * * *